United States Patent
Kim et al.

(10) Patent No.: US 10,673,012 B2
(45) Date of Patent: Jun. 2, 2020

(54) PANEL BOTTOM SHEET AND DISPLAY DEVICE INCLUDING THE SAME

(71) Applicant: Samsung Display Co., Ltd., Yongin-si, Gyeonggi-do (KR)

(72) Inventors: Min Seop Kim, Cheonan-si (KR); Kyung Jun Park, Hwaseong-si (KR); Jeong Seok Oh, Seoul (KR); Won Il Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 145 days.

(21) Appl. No.: 16/009,761

(22) Filed: Jun. 15, 2018

(65) Prior Publication Data

US 2018/0366679 A1 Dec. 20, 2018

(30) Foreign Application Priority Data

Jun. 19, 2017 (KR) .................. 10-2017-0077550

(51) Int. Cl.
*H01L 51/52* (2006.01)
*H01L 51/00* (2006.01)
(Continued)

(52) U.S. Cl.
CPC .......... *H01L 51/5237* (2013.01); *B32B 7/06* (2013.01); *B32B 7/12* (2013.01); *B32B 27/08* (2013.01); *G06F 3/0412* (2013.01); *H01L 51/0097* (2013.01); *B32B 2457/206* (2013.01); *B32B 2457/208* (2013.01);
(Continued)

(58) Field of Classification Search
CPC ............ G06F 3/041; G06F 1/1633; G06F 2203/04107; G06F 2203/04103; G06F 3/0412; G06F 2203/04102; B32B 7/05; B32B 7/06; B32B 7/12; B32B 37/12; B32B 37/18; B32B 37/0076; B32B 38/10; B32B 3/06; B32B 2457/20; B32B 2457/208; B32B 2551/00; B32B 2250/02; B32B 2571/00; B32B 27/08; B32B 27/323; B32B 2457/206; Y10T 428/14; Y10T 428/1471; Y10T 428/239; Y10T 428/24331; Y10T 428/24744; Y10T 156/1052; Y10T 156/10;
(Continued)

(56) References Cited

U.S. PATENT DOCUMENTS 3,950,580 A * 4/1976 Boudet .................. B65D 27/00
428/42.2
4,889,754 A * 12/1989 Vargas ...................... B32B 7/06
428/41.4
(Continued)

*Primary Examiner* — Patricia L. Nordmeyer
(74) *Attorney, Agent, or Firm* — Innovation Counsel LLP

(57) ABSTRACT

A panel bottom sheet and a display device including the same are provided. The panel bottom sheet comprises a main sheet, a bonding member disposed on a bottom surface of the main sheet and partially exposing the bottom surface of the main sheet, a release film disposed below the bonding member, and a spacer disposed between the release film and the bottom surface of the main sheet. The bottom surface of the main sheet is divided into a cover region in which the bonding member is disposed and an exposed region which is exposed by the bonding member. The release film is disposed to overlap with the cover region and the exposed region, and the spacer is disposed to overlap with the exposed region.

31 Claims, 19 Drawing Sheets

(51) Int. Cl.
   *G06F 3/041* (2006.01)
   *B32B 7/12* (2006.01)
   *B32B 27/08* (2006.01)
   *B32B 7/06* (2019.01)
   *H01L 27/32* (2006.01)

(52) U.S. Cl.
   CPC .. *G06F 2203/04102* (2013.01); *H01L 27/323* (2013.01); *H01L 51/529* (2013.01)

(58) Field of Classification Search
   CPC  H01L 51/5237; H01L 51/0097; H01L 51/529
   See application file for complete search history.

(56) References Cited

U.S. PATENT DOCUMENTS

| | | | |
|---|---|---|---|
| 8,044,942 B1 * | 10/2011 | Leonhard | G06F 1/1637 |
| | | | 345/173 |
| 8,974,620 B2 * | 3/2015 | Wilson | G06F 3/041 |
| | | | 156/247 |
| 9,128,545 B2 * | 9/2015 | Wilson | G06F 3/041 |
| 9,274,625 B2 * | 3/2016 | Wilson | G06F 3/041 |
| 9,283,731 B2 * | 3/2016 | Leonhard | B32B 3/10 |
| 9,582,039 B2 * | 2/2017 | Leonhard | G06F 1/1637 |
| 9,582,040 B2 * | 2/2017 | Leonhard | G06F 1/1637 |
| 9,656,821 B2 | 5/2017 | Kato et al. | |
| 10,345,934 B2 * | 7/2019 | Wilson | B32B 3/06 |
| 10,401,988 B2 * | 9/2019 | Leonhard | G06F 1/1637 |
| 2017/0266929 A1 * | 9/2017 | Wilson | B32B 7/06 |

* cited by examiner

PANEL BOTTOM SHEET AND DISPLAY DEVICE INCLUDING THE SAME

This application claims priority to Korean Patent Application No. 10-2017-0077550, filed on Jun. 19, 2017 and all the benefits accruing therefrom under 35 U.S.C. § 119, the disclosure of which is incorporated herein by reference in its entirety.

BACKGROUND

1. Field

The present disclosure relates to a panel bottom sheet and a display device including the same.

2. Description of the Related Art

Organic light-emitting display devices have many advantages such as their excellent luminance, driving voltage, and response speed characteristics and capability of realizing multiple colors and thus have been applied to various products, including smart phones. A typical organic light-emitting display includes a display panel including organic light-emitting elements. In each of the organic light-emitting elements, a cathode electrode and an anode electrode are arranged around an organic light-emitting layer. In response to a voltage being applied to the cathode and anode electrodes, visible light is generated in the organic light emitting layer to which the cathode and anode electrodes are both connected.

In the meantime, the typical organic light-emitting display device, which has been widely used in portable electronic devices such as smart phones, may be easily exposed to an external shock. Also, if excessive heat is generated in the organic light-emitting elements or driving chips for driving the organic light-emitting elements, the organic light-emitting elements may be damaged. In order to protect the organic light-emitting elements, a functional sheet having a heat dissipation function and a buffer function may be attached to the bottom surface of the display panel where the organic light-emitting elements are formed.

In a case where an adhesive layer is formed on the bottom surface of the functional sheet, the adhesive layer is covered and protected by a release film. The functional sheet may be attached to the display panel by pressing the functional sheet from the surface where the release film is disposed. However, since there often exists a height difference inside the functional sheet, pressing force may not be able to be uniformly applied to the functional sheet. As a result, the functional sheet may be lifted off of the display panel, instead of being stably attached on the display panel.

SUMMARY

Exemplary embodiments of the present disclosure provide a panel bottom sheet having a height difference which is compensated for.

Exemplary embodiments of the present disclosure also provide a display device including a panel bottom sheet having a height difference which is compensated for.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a panel bottom sheet. The panel bottom sheet comprises a main sheet, a bonding member disposed on a bottom surface of the main sheet and partially exposing the bottom surface of the main sheet, a release film disposed below the bonding member; and a spacer disposed between the release film and the bottom surface of the main sheet. The bottom surface of the main sheet is divided into a cover region in which the bonding member is disposed and an exposed region which is exposed by the bonding member. The release film is disposed to overlap with the cover region and the exposed region, and the spacer is disposed to overlap with the exposed region.

According to an exemplary embodiment of the present disclosure, there is provided a display device. The display device comprises a display panel, and a panel bottom sheet disposed below the display panel. The panel bottom sheet including a main sheet, a bonding member disposed on a bottom surface of the main sheet and partially exposing the bottom surface of the main sheet, a release film disposed below the bonding member, and a spacer disposed between the release film and the bottom surface of the main sheet. The bottom surface of the main sheet is divided into a cover region in which the bonding member is disposed and an exposed region which is exposed by the bonding member. The release film is disposed to overlap with the cover region and the exposed region, and the spacer is disposed to overlap with the exposed region.

According to the aforementioned and other exemplary embodiments of the present disclosure, since a height difference formed between a main sheet and a release film is compensated for by a spacer, any unevenness in pressing force applied to a panel bottom sheet to attach the panel bottom sheet to a display panel can be improved, and as a result, the panel bottom sheet can be prevented from being lifted off of the display panel.

In addition, defects in edge portions of a bonding member can be prevented, and a release film can be prevented from being bent or deformed when pressed.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
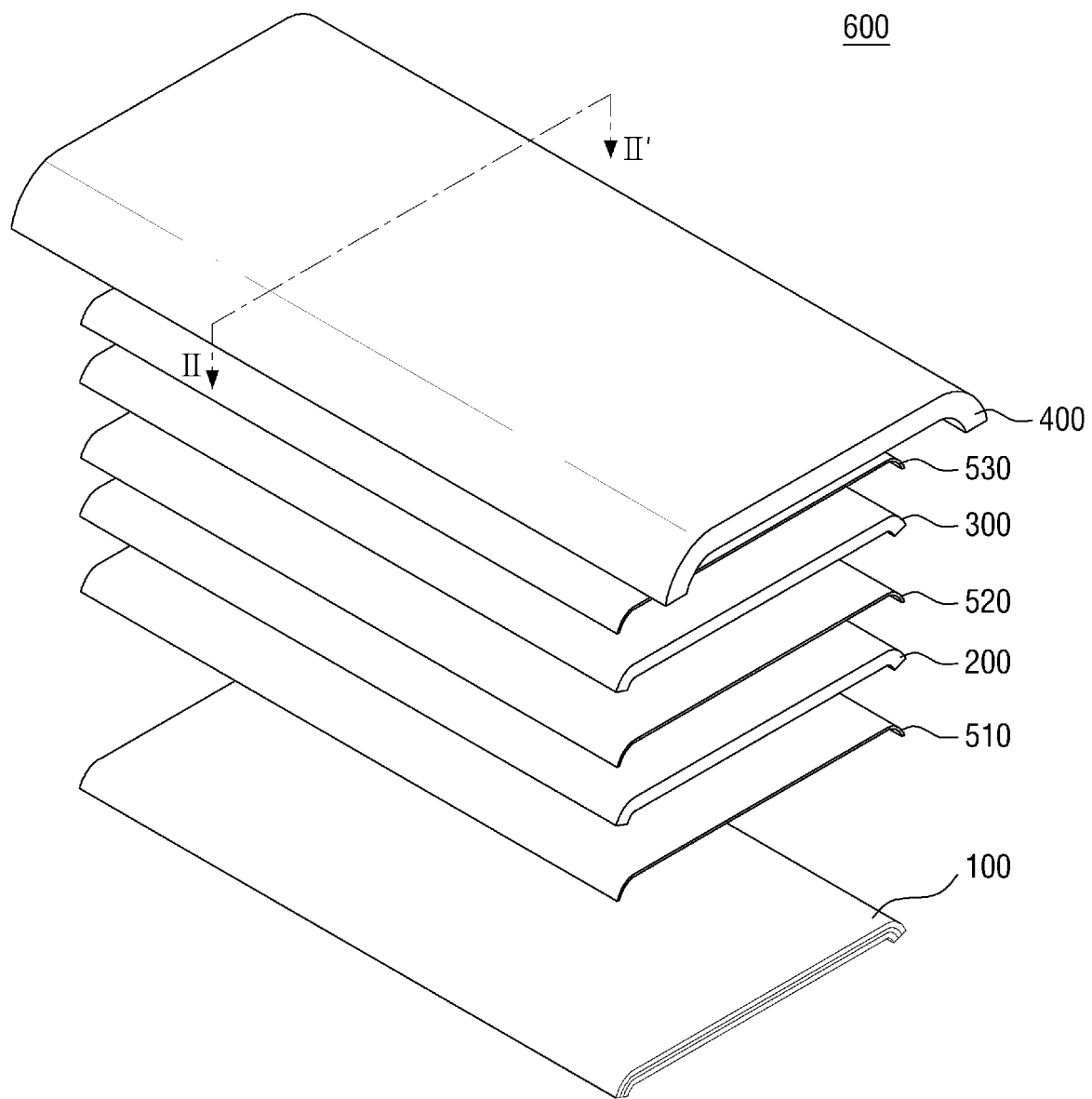
FIG. 1 is an exploded perspective view of a display device according to an exemplary embodiment of the present disclosure.

Features of the present disclosure and methods of accomplishing the same may be understood more readily by reference to the following detailed description of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure will only be defined within the scope of the appended claims.

Cases where elements or layers are referred to as being located "on" other elements or layers include all the cases where other layers or other elements are interposed directly on or between other elements. Meanwhile, cases where the elements are "directly on" indicate that no other element or layer is interposed therebetween. Same reference numerals refer to the same constituent elements throughout the specification. Term "and/or" includes each and every combination of one or more of the referenced items.

It will be understood that although the terms first, second, etc. may be used herein to describe various elements, these elements should not be limited by these terms. These terms are only used to distinguish one element from another element. Thus, a first element discussed below could be termed a second element without departing from the teachings of the inventive concept.

Exemplary embodiments of the present disclosure will hereinafter be described with reference to the accompanying drawings.

Figure 2:
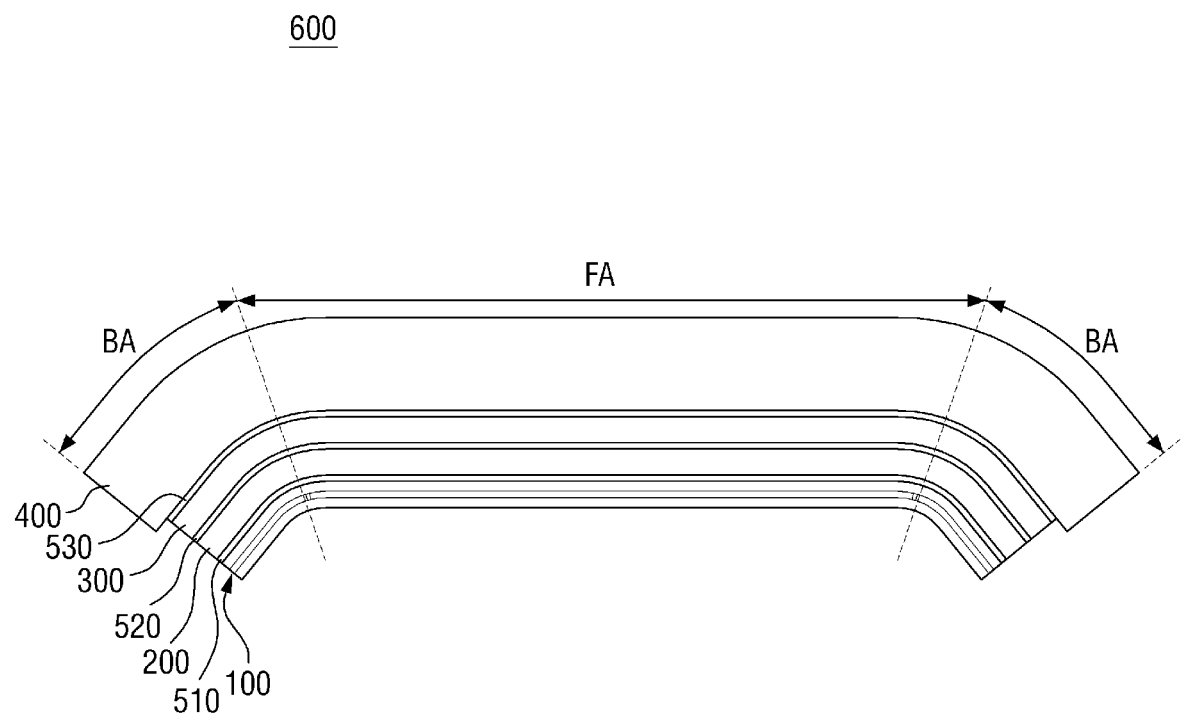
FIG. 2 is a cross-sectional view taken along line II-IF of FIG. 1.

FIG. 1 is an exploded perspective view of a display device 600 according to an exemplary embodiment of the present disclosure. FIG. 2 is a cross-sectional view taken along line II-II' of FIG. 1.

Referring to FIGS. 1 and 2, the display device 600 includes a display panel 200 and a panel bottom sheet 100 disposed below the display panel 200. The display device 600 may further include a window 400 disposed above the display panel 200. Unless specified otherwise, the terms "upper", "top" or "top surface", and "above," as used herein, refer to a display surface side of the display panel 200, and the terms "lower", "bottom" or "bottom surface", or "below," as used herein, refer to an opposite side to the display surface side of the display panel 200.

The display device 600 may be rectangular in a plan view. The display device 600 may have two long sides and two short sides. The long sides and the short sides of the display device 600 meet at a right angle. Alternatively, as illustrated in FIG. 1, the long sides and the short sides of the display device 600 meet to form curved surfaces. The planar shape of the display device 600 is not particularly limited, and the display device 600 may be in a shape other than a rectangular shape, such as, for example, a circular shape, in a plan view.

The display panel 200 is a panel for displaying an image and may be, for example, an organic light-emitting display panel. The display panel 200 will hereinafter be described as being an organic light-emitting display panel, but various types of display panels other than an organic light-emitting display panel, such as, for example, a liquid crystal display (LCD) panel, an electrophoretic display panel, or the like may be used as the display panel 200.

The display panel 200 includes a plurality of organic light-emitting elements disposed on a substrate. The substrate may be a rigid substrate formed of, for example, glass, or may be a flexible substrate formed of, for example, polyimide (PI). In a case where a PI substrate is used as the substrate, the display panel 200 may be bendable, foldable, and/or rollable.

The window 400 is disposed above the display panel 200. The window 400 protects the display panel 200 from above and allows the transmission of light emitted from the display panel 200. The window 400 may be formed of, for example, glass or a plastic material such as PI.

The window 400 may be disposed to overlap with the display panel 200 and to cover the entire surface of the display panel 200. The window 400 may be larger in size than the display panel 200. For example, the window 400 may protrude beyond the display panel 200 on both short sides of the display device 600.

In one exemplary embodiment, a touch member 300 may be disposed between the display panel 200 and the window 400. The touch member 300 may be of a panel type or a film type. The touch member 300 may have substantially the same size as the display panel 200 and may be disposed to overlap with the display panel 200 so that the sides thereof can be aligned with the sides of the display panel 200, but the present disclosure is not limited thereto. The display panel 200 and the touch member 300 may be bonded together by a transparent bonding layer 520 such as an optically clear adhesive (OCA) or an optically clear resin (OCR), and the touch member 300 and the window 400 may be bonded together by a transparent bonding layer 530 such as an OCA or an OCR. The touch member 300 may not be provided, in which case, the display panel 200 and the window 400 may be bonded together by an OCA or an OCR. In one exemplary embodiment, the display panel 200 may include a touch electrode unit.

The panel bottom sheet 100 is disposed below the display panel 200. An inter-panel-sheet bonding layer 510 may be disposed between the panel bottom sheet 100 and the display panel 200. The panel bottom sheet 100 may be attached to the bottom surface of the display panel 200 via the inter-panel-sheet bonding layer 510. In the exemplary embodiment of FIG. 1, the inter-panel-sheet bonding layer 510 may be provided as a separate element from the panel bottom sheet 100, but may be included in the panel bottom sheet 100 as a top bonding layer. The inter-panel-sheet bonding layer 510 may be formed of one of examples of the material of first and second bonding layers 22 and 23 that will be described later.

The panel bottom sheet 100 may have substantially the same size as the display panel 200 and may be disposed to overlap with the display panel 200 so that the sides thereof can be aligned with the sides of the display panel 200, but the present disclosure is not limited thereto. The panel bottom sheet 100 may perform a heat dissipation function, an electromagnetic shielding function, a grounding function, a buffer function, a reinforcement function, and/or a digitizing function. The panel bottom sheet 100 will be described later in detail.

In one exemplary embodiment, the display device 600 may include a flat area FA and a bending area BA connected to the flat area FA and disposed adjacent to the flat area FA. The flat area FA may be disposed substantially on one plane. The bending area BA is not on the same plane as the flat area FA. For example, the bending area BA may be bent downwardly from the plane where the flat area FA is disposed.

In one exemplary embodiment, the bending area BA may have outwardly convex surfaces. In another exemplary embodiment, the bending area BA may have flat surfaces that are disposed on a plane(s) having a predetermined angle(s) with respect to the plane of the flat area FA.

The bending area BA may include two or more separated bending areas and may be provided on both long sides of the display device 600, which is rectangular, or on one of the long sides of the display device 600. Although not specifically illustrated, the display device 600 may also be bent on the short sides thereof.

The display panel 200, the touch member 300, the window 400, and the panel bottom sheet 100 may all be positioned in both the flat area FA and the bending area BA.

In an alternative example, the display device 600 may be a flat display device only having the flat area FA. Thus, all the aspects of the display device 600 discussed herein, except for those specifically related to the bending area BA, may be directly applicable not only to a bendable display device, but also to a flat display device.

Figure 3:
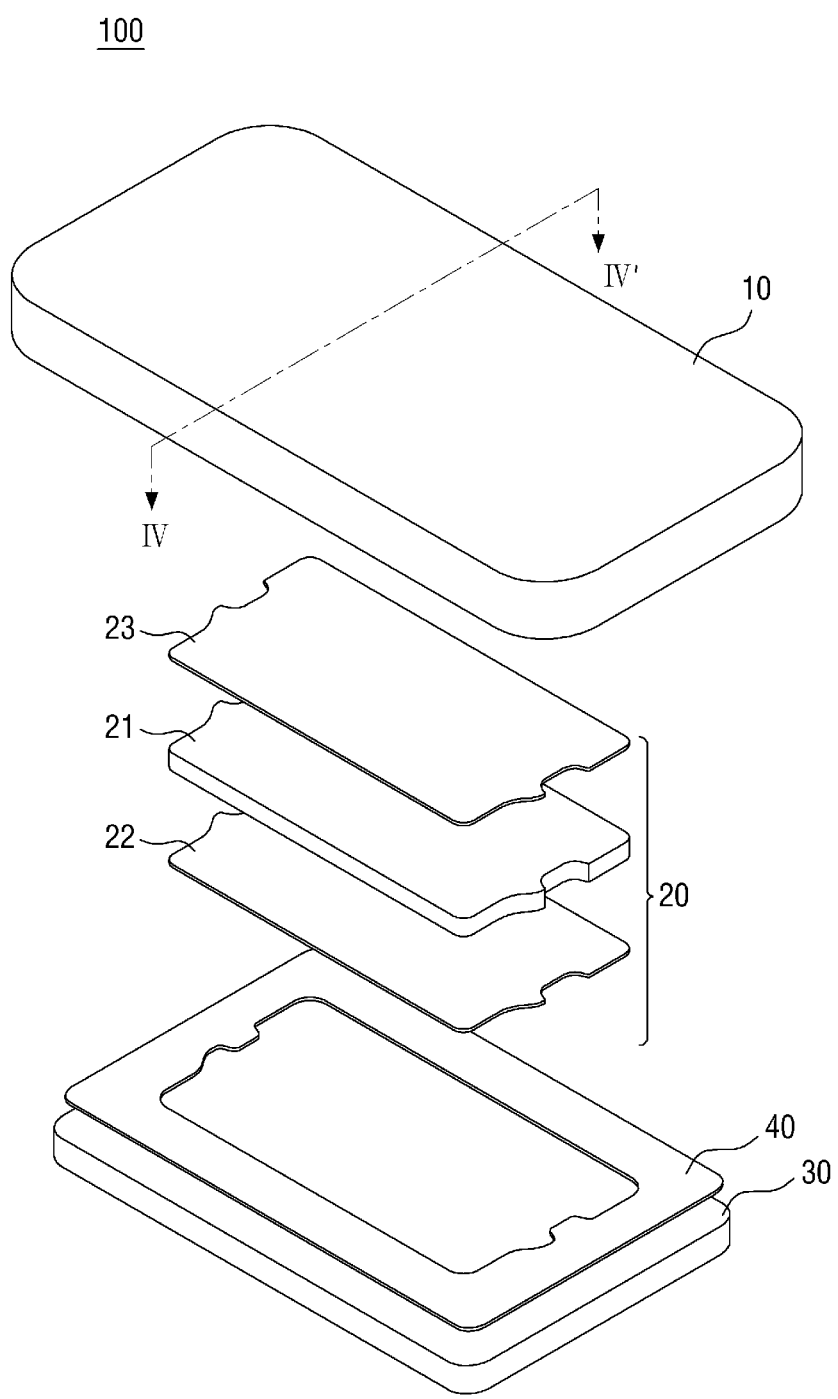
FIG. 3 is an exploded perspective view of a panel bottom sheet according to an exemplary embodiment of the present disclosure.
Figure 4:
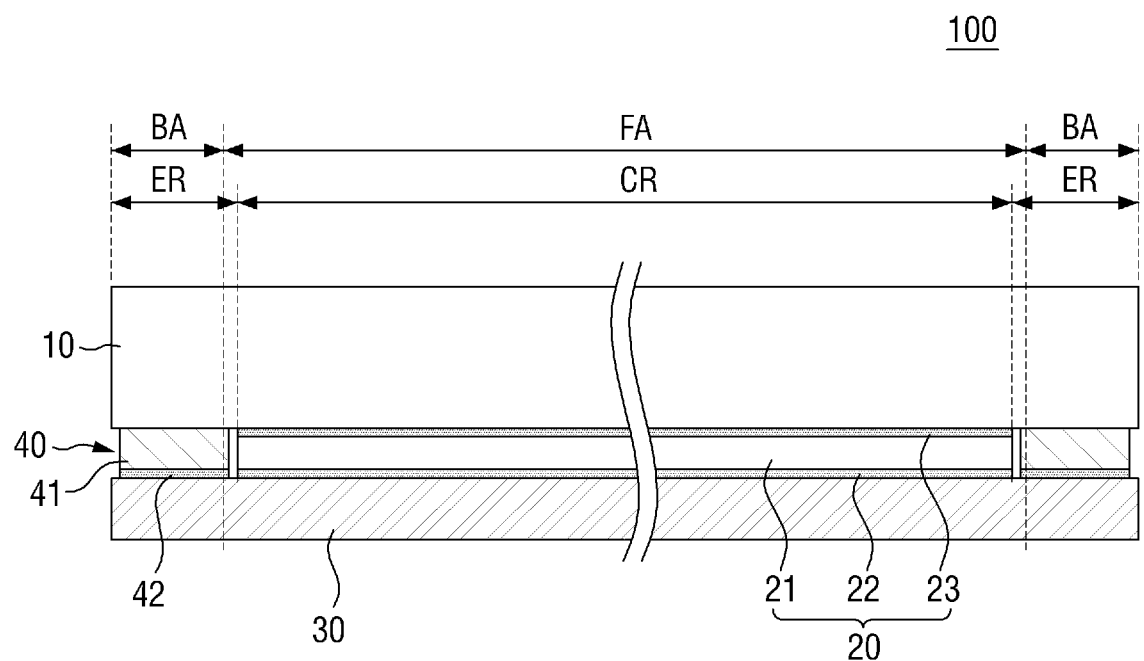
FIG. 4 is a cross-sectional view taken along line IV-IV' of FIG. 3.
Figure 5:
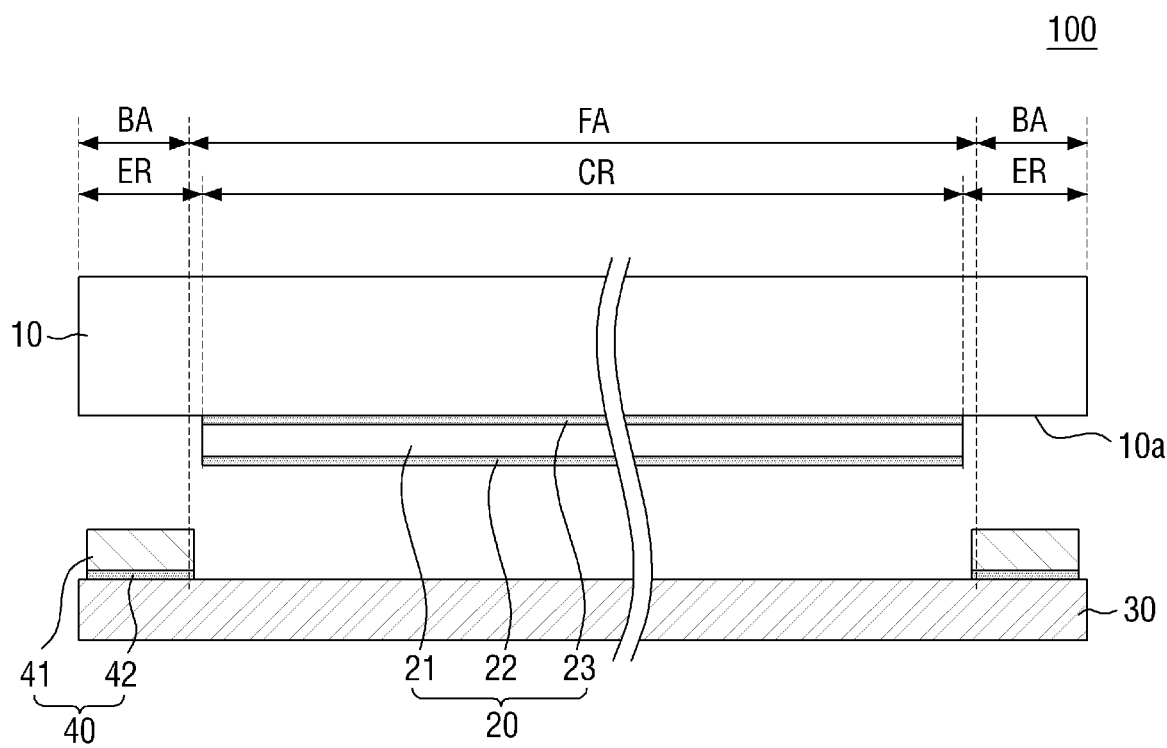
FIG. 5 is a cross-sectional view showing a state in which a first release film is separated from the panel bottom sheet according to the exemplary embodiment of FIG. 3.
Figure 6:
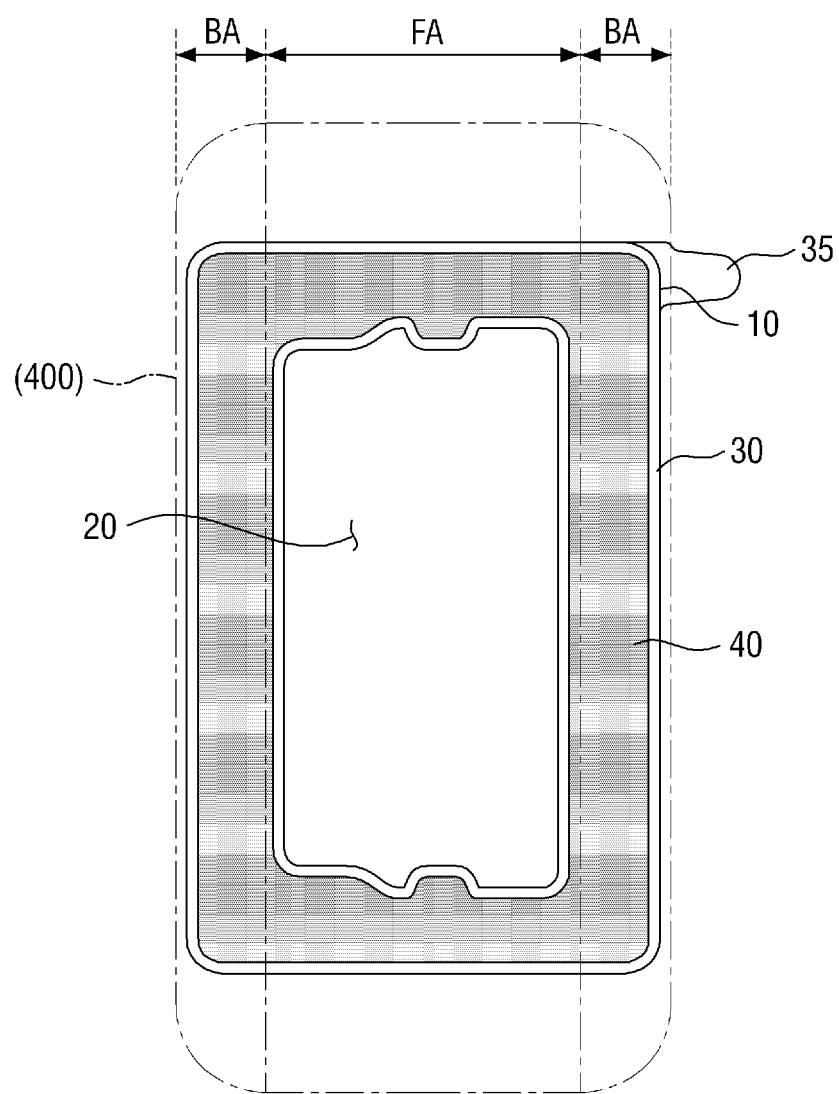
FIG. 6 is a layout view of the panel bottom sheet according to the exemplary embodiment of FIG. 3.

The panel bottom sheet 100 will hereinafter be described. FIG. 3 is an exploded perspective view of a panel bottom sheet 100 according to an exemplary embodiment of the present disclosure. FIG. 4 is a cross-sectional view taken along line IV-IV' of FIG. 3. FIG. 5 is a cross-sectional view showing a state in which a first release film 30 is separated from the panel bottom sheet 100 according to the exemplary embodiment of FIG. 3. FIG. 6 is a layout view of the panel bottom sheet 100 according to the exemplary embodiment of FIG. 3. For convenience, FIGS. 3 through 6 illustrate the panel bottom sheet 100 as generally being flat. When attached to a display panel 200, the panel bottom sheet 100, which is illustrated in FIGS. 3 through 6 as being flat, is bent along with the display panel 200, which is already bent. In FIGS. 2, 4, and 5, dotted lines represent the boundaries between a flat area FA and bending area BA. For a better understanding, FIG. 6 illustrates a window 400 along with the panel bottom sheet 100.

Referring to FIGS. 3 through 6, the panel bottom sheet 100 includes a main sheet 10, a bottom bonding member 20, the first release film 30, and a spacer 40.

The main sheet 10 includes one or more functional layers. The functional layers may be layers performing a heat dissipation function, an electromagnetic shielding function, a grounding function, a buffer function, a reinforcement function, a support function, and/or a digitizing function. The functional layers may be sheet layers, film layers, thin films, coating layers, panels, or plates. Each of the functional layers may be formed as a single layer or as a stack of a plurality of thin films or coating layers. The functional layers may be, for example, bases, heat dissipation layers, electromagnetic shielding layers, shock absorbing layers, or digitizers.

The main sheet 10 may include a plurality of functional layers and interlayer bonding layers that couple the functional layers to one another. A pair of adjacent functional layers may be coupled together by an interlayer bonding layer. The functional layers and the interlayer bonding layers may have the same planar size, but the present disclosure is not limited thereto. That is, alternatively, all or some of the functional layers and the interlayer bonding layers may have different sizes. Some of the functional layers and/or some of the interlayer bonding layers may protrude beyond the other functional layers and/or the other interlayer bonding layers, only in a particular direction or in all directions. The planar outer shape of the main sheet 10 may be defined by connecting the most protruding parts of the functional layers and the interlayer bonding layers. The arrangement of the functional layers and the interlayer bonding layers will be described later.

The bottom bonding member 20 is disposed on a bottom surface 10a of the main sheet 10. The bottom surface 10a of the main sheet 10 may include a single layer or multiple layers. For example, in a case where a lowermost layer of the main sheet 10 is smaller in size than a second lowermost layer of the main sheet 10 and, as a result, part of the bottom surface of the second lowermost layer is exposed, the bottom surface 10a of the main sheet 10 may include both the bottom surface of the lowermost layer and the exposed part of the bottom surface of the second lowermost layer.

The bottom bonding member 20 is covered and protected by the first release film 30, but during assembly, the first release film 30 is separated, and as a result, the surface of the bottom bonding member 20, particularly, the bottom surface of the bottom bonding member 20, may be exposed. A set bracket (not illustrated) may be attached to the exposed surface (i.e., the exposed bottom) of the bottom bonding member 20.

In one exemplary embodiment, the bottom bonding member 20 may be a double-sided tape. The double-sided tape includes a base 21, a first bonding layer 22 disposed on the bottom surface of the base 21, and a second bonding layer 23 disposed on the top surface of the base 21. The base 21 may be formed of polyethylene terephthalate (PET, PI, polycarbonate (PC), polyethylene (PE), polypropylene (PP), polysulfone (PSF), polymethyl methacrylate (PMMA), triacetyl cellulose (TAC), or a cyclo-olefin polymer (COP).

The first and second bonding layers 22 and 23 may include adhesive layers or resin layers. For example, the first and second bonding layers 22 and 23 may comprise a polymer material such as a silicone polymer, a urethane polymer, a silicone-urethane (SU) hybrid polymer, an acrylic polymer, an isocyanate polymer, a polyvinyl alcohol polymer, a gelatin polymer, a vinyl polymer, a latex polymer, a polyester polymer, or a water-based polyester polymer.

In another exemplary embodiment, the bottom bonding member 20 may be provided as a single adhesive layer. That is, the bottom bonding member 20 may be provided as, for example, a single coating layer comprising the same material as, or a similar material to, the first and second bonding layers 22 and 23.

The bottom bonding member 20 is disposed only on part of the bottom surface 10a of the main sheet 10 and exposes the rest of the bottom surface 10a of the main sheet 10. Since the bottom bonding member 20 has a predetermined thickness, a height difference may be formed between an area where the bottom bonding member 20 is provided and an area where the bottom bonding member 20 is not disposed.

The bottom surface 10a of the main sheet 10 may be divided into a cover region CR in which the bottom bonding member 20 is disposed and an exposed region ER in which the bottom bonding member 20 is not disposed. In one exemplary embodiment, the bottom bonding member 20 may be generally smaller in size than the main sheet 10. The bottom bonding member 20 may be disposed at a central portion of the bottom surface 10a of the main sheet 10 and may expose edge portions of the main sheet 10. In this case, the central portion of the bottom surface 10a of the main sheet 10 may become the cover region CR, and portions along the sides of the bottom surface 10a of the main sheet 10, i.e., bottom edge portions of the main sheet 10, may become the exposed region ER.

In a case where the panel bottom sheet 100 is attached on the display panel 200 that is bent, the cover region CR may be located within the flat area FA, but may not overlap with the bending area BA. The exposed region ER may completely overlap with the bending area BA in a widthwise direction along the long sides of the panel bottom sheet 100 and may extend into the flat area FA.

The first release film 30 is disposed on the bottom surface of the bottom bonding member 20. The first release film 30 protects the bottom surface of the bottom bonding member 20. The first release film 30 may be placed in contact with the bottom bonding member 20, but may not be completely attached on the bottom bonding member 20 so as to be able to be peeled off of the bottom bonding member 20 later. The first release film 30 may comprise PET, PC, PI, or paper. In order to improve the release force of the first release film 30, the top surface of the first release film 30 may be treated with a silicon solution or coated with a release coating layer, but the present disclosure is not limited to this.

The first release film 30 may cover the entire bottom bonding member 20, and may further be disposed even in the area where the bottom bonding member 20 is not disposed. That is, the first release film 30 may overlap with the cover region CR of the bottom surface 10a of the main sheet 10 and may also overlap with the exposed region ER of the bottom surface 10a of the main sheet 10. In one exemplary embodiment, the first release film 30 may completely cover the bottom surface 10a of the main sheet 10.

The first release film 30 may include a protruding portion 35 not overlapping with the bottom surface 10a of the main sheet 10. The protruding portion 35 may protrude outwardly from one side of the main sheet 10. Since the protruding portion 35 is provided to protrude from the main sheet 10, the first release film 30 can be selectively grabbed with ease with a hand or tool. Accordingly, the first release film 30 is easily removable in the process of attaching the set bracket to the bottom bonding member 20.

The spacer 40 is disposed between the top surface of the first release film 30 and the bottom surface 10a of the main sheet 10 in an area overlapping with the exposed region ER of the bottom surface 10a of the main sheet 10. The spacer 40 may not overlap with the bottom bonding member 20. The spacer 40 may compensate for a height difference formed by the presence of the bottom bonding member 20. That is, the spacer 40 may serve as means for compensating for a height difference. The spacer 40 may maintain a predetermined spacing between the bottom surface 10a of the main sheet 10 and the top surface of the first release film 30. The functions of the spacer 40 during a pressing process will hereinafter be described with reference to FIGS. 7 and 8.

Figure 7:
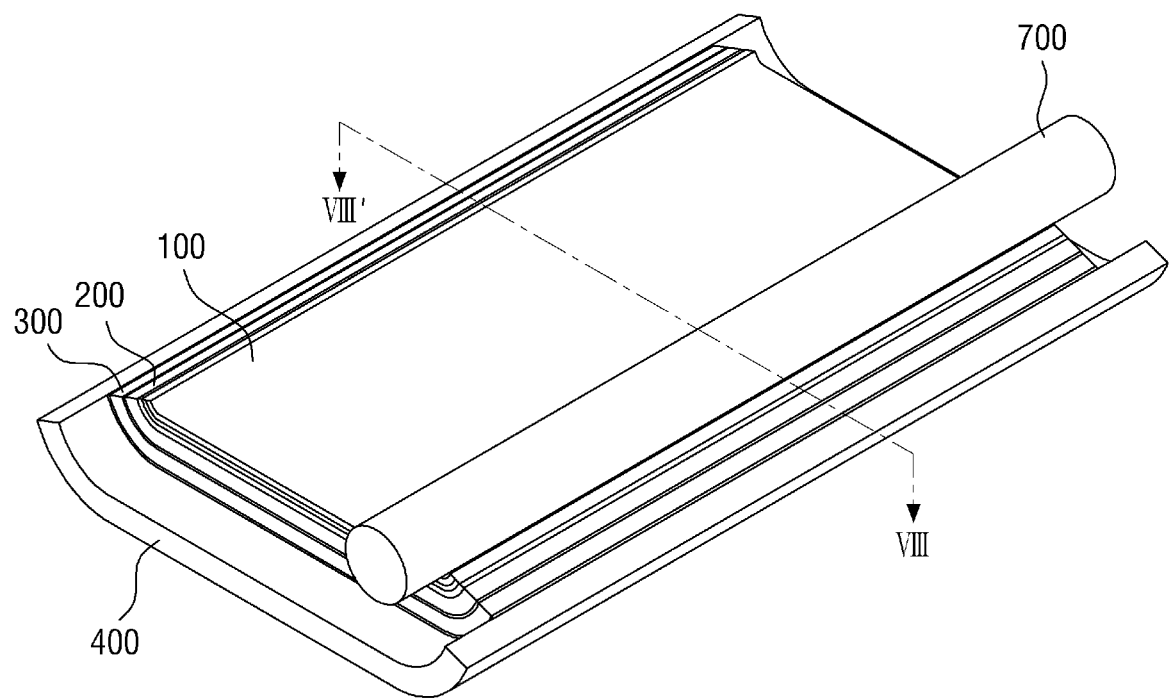
FIG. 7 is a perspective view showing how to attach the panel bottom sheet according to the exemplary embodiment of FIG. 3 to a display panel.
Figure 8:
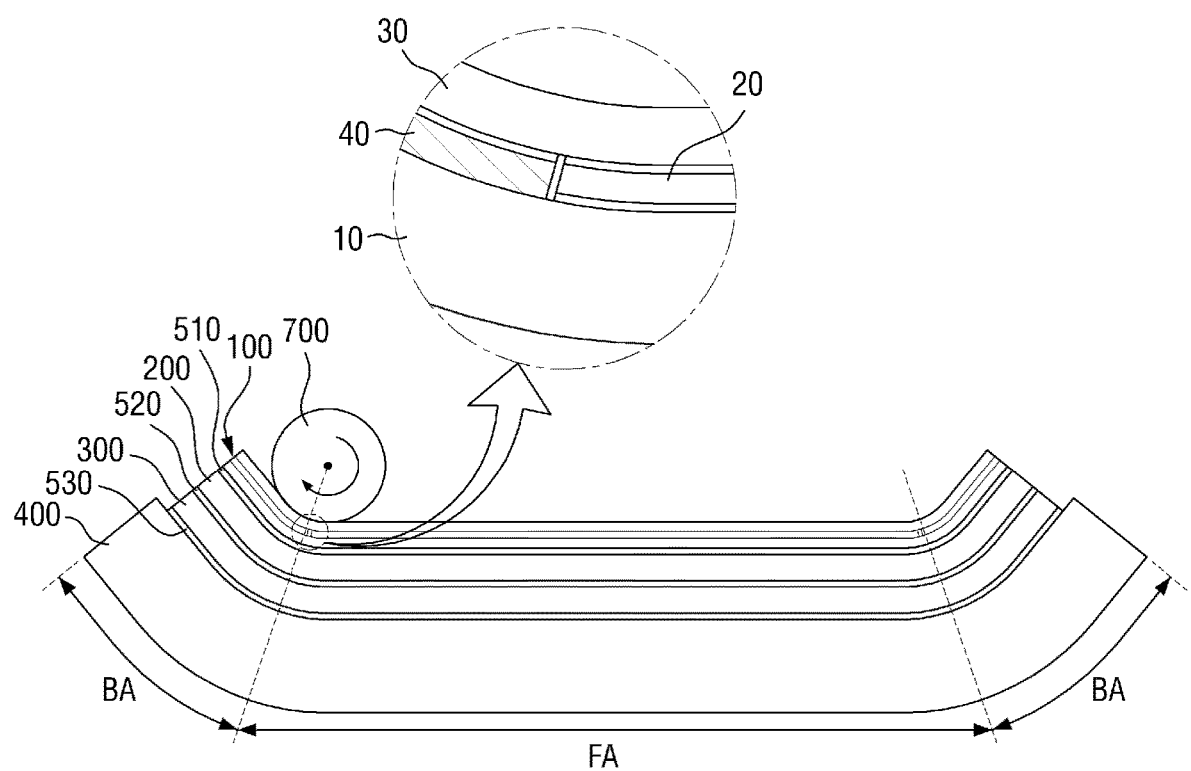
FIG. 8 is a cross-sectional view taken along line VIII-VIII' of FIG. 7.

FIG. 7 is a perspective view showing how to attach the panel bottom sheet according to the exemplary embodiment of FIG. 3 to a display panel. FIG. 8 is a cross-sectional view taken along line VIII-VIII' of FIG. 7.

Referring to FIGS. 7 and 8, in order to attach the panel bottom sheet 100 to a display panel 200, the display panel 200 and the panel bottom sheet 100 are prepared. The display panel 200 may be already attached to a window 400 together with a touch member 300. In a case where the window 400 includes the bending area BA, the display panel 200 and the touch member 300 may also include the bending area BA.

Thereafter, the inter-panel-sheet bonding layer 510 is disposed on the bottom surface of the display panel 200, and the panel bottom sheet 100 is arranged below the display panel 200. Thereafter, the display panel 200 and the panel bottom sheet 100 are bonded together by performing a pressing process from the bottom of the panel bottom sheet 100, i.e., from the bottom of the first release film 30. The pressing process may be performed as, for example, a rolling process. Specifically, a roller 700, which extends in a direction of the long sides of the display panel 200, is placed on the bottom surface of the panel bottom sheet 100, and pressure is applied to the entire panel bottom sheet 100 by moving the roller 700 from one long side to the other long side of the display panel 200.

The pressing process may suitably be performed so as to uniformly apply pressure to the entire bottom surface of the panel bottom sheet 100. However, if there exists a height difference, pressure may not be able to be uniformly applied to the panel bottom sheet 100 during the rolling process. In general, a lower pressing force may be transmitted to an area with a relatively small height (i.e., an area relatively far from the roller 700) than an area with a relatively large height (i.e., parts relatively close to the roller 700).

If pressing force is low at a particular location, the bonding force between the display panel 200 and the lower panel sheet 100 may weaken at the particular position. If the bonding force between the display panel 200 and the panel bottom sheet 100 weakens, the panel bottom sheet 100 may be lifted off of the display panel 200.

Also, in a case where an embossed shape is formed on one or both surfaces of the inter-panel-sheet bonding layer 510 to secure an air passage, the embossed shape is supposed to collapse after the attachment of the panel bottom sheet 100 to the display panel 200. However, if too low a pressing force is applied, part of the embossed shape may remain on the inter-panel-sheet bonding layer 510, instead of collapsing. In this case, gaps may be formed between the inter-panel-sheet bonding layer 510 and the display panel 200 or between the inter-panel-sheet bonding layer 510 and the panel bottom sheet 100 due to the presence of the embossed shape, and water or another foreign material may infiltrate through the gaps, thereby deteriorating waterproofness.

The spacer 40 improves unevenness in pressing pressure applied to the panel bottom sheet 100 that may be caused by a height difference. Since the spacer 40 is disposed in an area where the bottom bonding member 20 is not formed and fills the gap between the bottom surface of the panel bottom sheet 100 and the top surface of the first release film 30 in the corresponding area, a height difference may be compensated for. As a result, too low a pressing force can be prevented from being applied to the area where the bottom bonding member 20 is not formed.

Also, the spacer 40 may prevent the edge portions of the bottom bonding member 20 from being damaged or deformed. Specifically, if the bottom bonding member 20 protrudes downwardly to have a height difference with the display panel 200, the edge portions of the bottom bonding member 20 may receive too much force during the pressing process using the roller 700 and may thus be damaged or deformed. Since the spacer 40 compensates for the height difference between the bottom bonding member 20 and the display panel 200, deformation of the edge portions of the bottom bonding member 20 can be prevented. Also, the spacer 40 may prevent the first release film 30 from being bent or deformed in the area where the bottom bonding member 20 is not formed, during the pressing process.

The spacer 40 may prevent or alleviate deformation of the bottom bonding member 20 by surrounding the bottom bonding member 20. If an external shock is applied, the spacer 40 may absorb some of the external shock and may thus alleviate the impact on the bottom bonding member 20. Also, the spacer 40 may prevent water or another foreign material from infiltrating into the sides of the bottom bonding member 20. Also, the spacer 40 may prevent deformation of the bottom bonding member 20 or weakening of the bonding force of the bottom bonding member 20 by preventing the sides of the bottom bonding member 20 from being exposed and dried.

FIGS. 7 and 8 illustrate an example in which the panel bottom sheet 100 is attached to the display panel 200 by forming the inter-panel-sheet bonding layer 510 on the bottom surface of the display panel 200. However, alternatively, a first panel bottom sheet may be attached to the bottom surface of the display panel 200, and a second panel bottom sheet may be attached to the bottom surface of the first panel bottom sheet. In this alternative example, the first and second panel bottom sheets may be attached to the display panel 200 using the same method used to attach the panel bottom sheet 100 to the display panel 200, as illustrated in FIGS. 7 and 8.

Referring again to FIGS. 3 through 6, the bottom surface of the spacer 40 may be physical bonded and fixed to the top surface of the first release film 30. For example, the bottom surface of the spacer 40 may be attached to the top surface of the first release film 30. On the other hand, the top surface of the spacer 40 may not be fixed. The top surface of the spacer 40 may be placed in contact with, or spaced apart from, the bottom surface 10a of the main sheet 10 depending on the thickness and other conditions of the spacer 40. That is, the top surface of the spacer 40 may not be physically bonded to the bottom surface 10a of the main sheet 10. However, even in a case where the top surface of the spacer 40 is spaced apart from the bottom surface 10a of the main sheet 10, the top surface of the spacer 40 and the bottom surface 10a of the main sheet 10 may be placed in contact with each other during the pressing process for attaching the panel bottom sheet 100 to the display panel 200.

In one exemplary embodiment, the spacer 40 may include a spacing member 41 and a bottom bonding layer 42. The bottom bonding layer 42 is disposed on the top surface of the first release film 30, and the spacing member 41 is disposed on the bottom bonding layer 42. The spacing member 41 may be attached to the top surface of the first release film 30 via the bottom bonding layer 42.

The material of the spacing member 41 is not particularly limited as long as the spacing member 41 can maintain a predetermined gap. For example, the spacing member 41 may comprise PET, PI, PC, PP, PSF, PMMA, TAC, or a COP. The spacing member 41 may be formed of a material having elasticity or a shock-absorbing material such as polyurethane (PU). The spacing member 41 may be formed of a material that can be used as a general base.

The bottom bonding layer 42, like the first and second bonding layers 22 and 23, may include an adhesive layer or a resin layer.

For example, a single-sided tape may be used as the spacing member 41 including the spacing member 41 and the bottom bonding layer 42.

In one exemplary embodiment, the thickness of the spacer 40 may be the same as the thickness of the bottom bonding member 20. In this example, the spacer 40 can maintain a uniform spacing between the bottom surface 10a of the main sheet 10 and the first release film 30 in and across the area where the bottom bonding member 20 is disposed and an area where the spacer 40 is disposed, and can thus eliminate a height difference.

In another exemplary embodiment, the thickness of the spacer 40 may be smaller than the thickness of the bottom bonding member 20. In this example, the spacing between the bottom surface 10a of the main sheet 10 and the first release film 30 is narrower in the area where the spacer 40 is disposed than in the area where the bottom bonding member 20 is disposed, but a height difference still can be reduced.

In another exemplary embodiment, the thickness of the spacer 40 may be larger than the thickness of the bottom bonding member 20. In this example, the spacing between the bottom surface 10a of the main sheet 10 and the first release film 30 is narrower in the area where the bottom bonding member 20 is disposed than in the area where the spacer 40 is disposed, but since the thickness of the spacer 40 can be reduced by pressure applied to attach the panel bottom sheet 100 to the display panel 200, uniform pressure can be provided to the bottom bonding member 20 during the pressing process.

In a case where the bottom surface 10a of the main sheet 10 has a height difference, for example, in a case where the cover region CR protrudes downwardly beyond the exposed region ER, the thickness of the spacer 40 may be larger than the thickness of the bottom bonding member 20. The thickness of the spacer 40 may be the same as, or may be larger or smaller than, the sum of the thickness of the bottom bonding member 20 and the height difference on the bottom surface 10a of the main sheet 10.

The spacer 40 may generally overlap with the exposed region ER of the main sheet 10, and the planar shape of the spacer 40 may be substantially the same as the planar shape of the exposed region ER. In a case where the exposed region ER of the bottom surface 10a of the main sheet 10 is in the shape of a rectangular frame, the spacer 40 may also be in the shape of a rectangular shape. That is, the spacer 40 may be formed to extend continuously along the sides of the first release film 30 or the bottom surface 10a of the main sheet 10. The spacer 40 may surround the bottom bonding member 20. If the cover region CR of the bottom surface 10a of the main sheet 10 has a particular outer profile, the spacer 40 may be formed to have an inner profile corresponding to the particular outer profile of the cover region CR, but the present disclosure is not limited thereto.

The spacer 40 may completely fill the entire exposed region ER of the main sheet 10, or may expose part of the exposed region ER. Specifically, the inner sides of the spacer 40 may be spaced apart from the sides of the bottom bonding member 20 to be easily detachable from the bottom bonding member 20. The outer sides of the spacer 40 may be aligned with the outer sides of the main sheet 10 or may be positioned more inwardly than the outer sides of the main sheet 10. Part of the spacer 40 disposed in the exposed region ER of the main sheet 10, but not overlapping with the exposed region ER, may correspond to an area where the bottom surface 10a of the main sheet 10 and the top surface of the first release film 30 are still spaced apart from each other, and may have a height difference with the rest of the spacer 40. However, since the width of the part of the spacer 40 with a height difference with the rest of the spacer 40 can be reduced, unevenness in pressing force provided by the roller 700 can be improved, and a substantially uniform pressing force can be provided especially when the width of the part of the spacer 40 with a height difference with the rest of the spacer 40 is much smaller than the size (i.e., the diameter) of the roller 700.

Panel bottom sheets according to other exemplary embodiments of the present disclosure will hereinafter be described. In FIGS. 1 through 17, like reference numerals denote like elements, and thus, descriptions thereof will be omitted or at least simplified.

Figure 9:
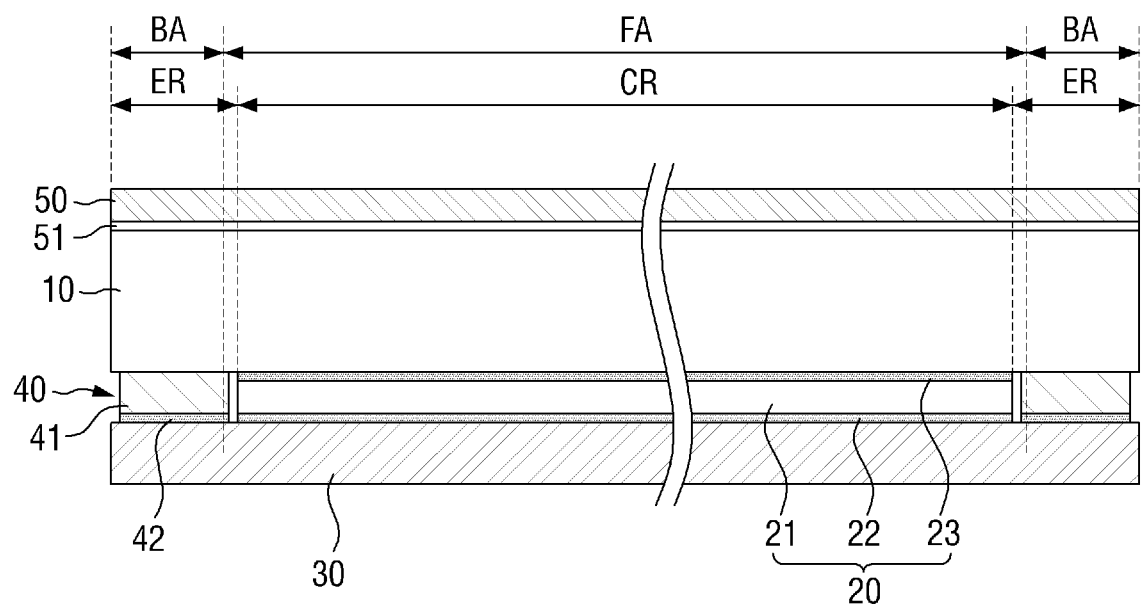
FIG. 9 is a cross-sectional view of a panel bottom sheet according to another exemplary embodiment of the present disclosure.

FIG. 9 is a cross-sectional view of a panel bottom sheet 101 according to another exemplary embodiment of the present disclosure. Specifically, FIG. 9 shows that the panel bottom sheet 101 may additionally include a top bonding layer 51.

Referring to FIG. 9, the panel bottom sheet 101 may include the top bonding layer 51 disposed on the top surface of a main sheet 10 and a second release film 50 disposed on the top surface of the top bonding layer 51.

The top bonding layer 51 may be larger in size than a bottom bonding member 20. The top bonding layer 51 may not only overlap with the bottom bonding member 20, but also protrude outwardly beyond the sides of the bottom bonding member 20. The sides of the bottom bonding member 20 may be positioned more inwardly than the sides of the top bonding layer 51.

In one exemplary embodiment, the top bonding layer 51 may be disposed to cover the entire top surface of the main sheet 10. The sides of the top bonding layer 51 may be aligned with the sides of the main sheet 10. The top bonding layer 51 may bond the panel bottom sheet 101 to a display panel 200 or to another panel bottom sheet. In a case where the panel bottom sheet 101 is attached to the display panel 200, the inter-panel-sheet bonding layer 510 of FIGS. 1 and 2 may not be provided, and the top bonding layer 51 may perform the functions of the inter-panel-sheet bonding layer 510 of FIGS. 1 and 2. The top bonding layer 51 may be formed of one of the aforementioned examples of the material of the first and second bonding layers 22 and 23 of the panel bottom sheet 100 according to the exemplary embodiment of FIG. 3.

The second release film 50 is disposed on the top surface of the top bonding layer 51. The second release film 50 protects the top surface of the top bonding layer 51. The second release film 50 is placed in contact with the top bonding layer 51, but not completely, so as to be able to be peeled off later. The second release film 50 may be substantially the same as the first release film 30. The sides of the second release film 50 except for a protruding portion of the second release film 50 may be aligned with the sides of the top bonding layer 51. The second release film 50 may not be provided or may be peeled away later.

Figure 10:
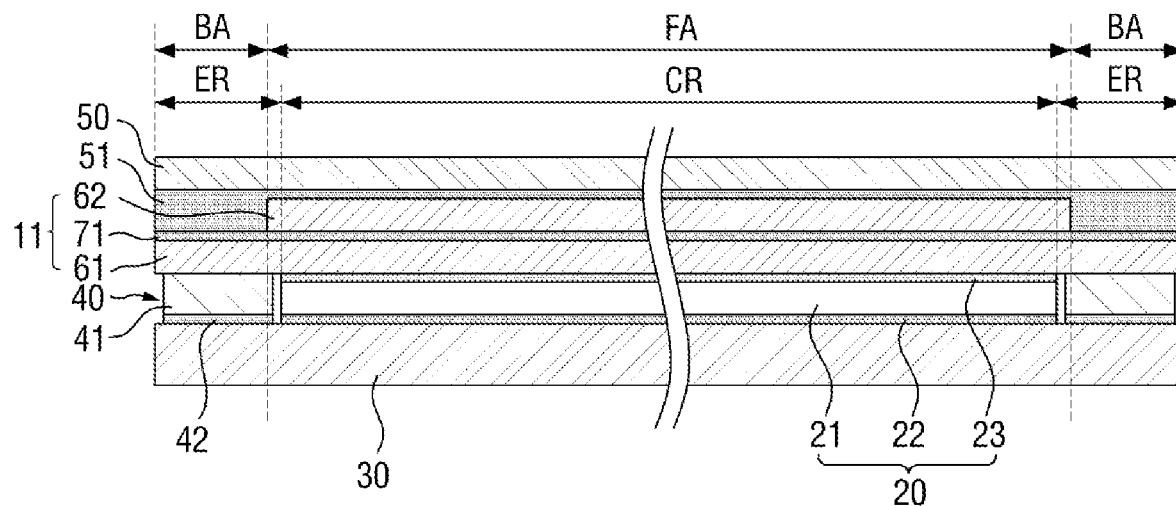
FIGS. 10, 11, and 12 are cross-sectional views of panel bottom sheets according to other exemplary embodiments of the present disclosure.
Figure 11:
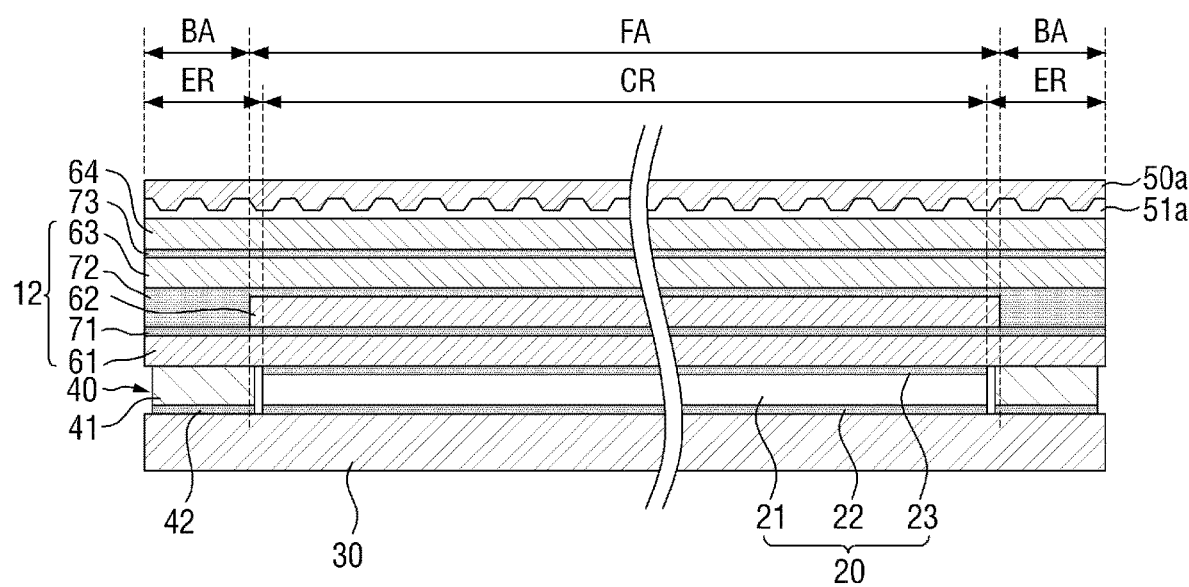
Figure 12:
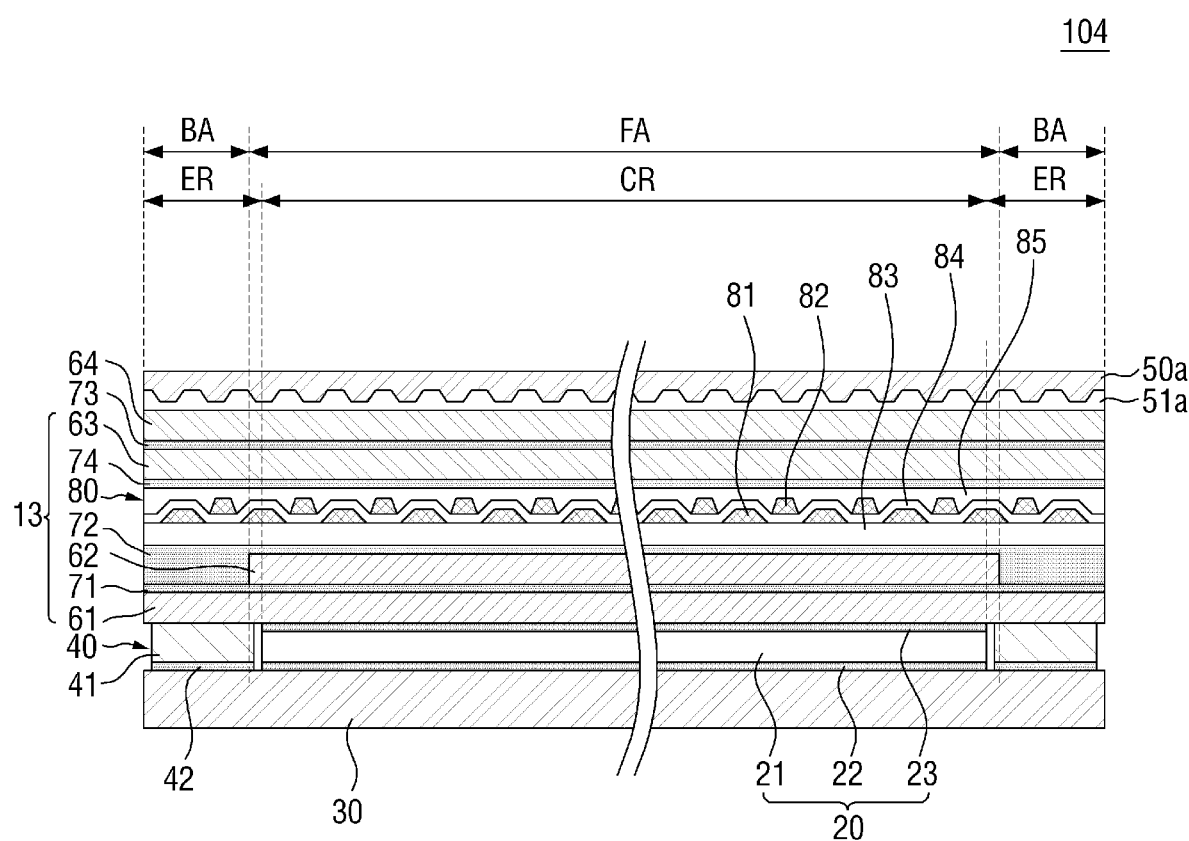

FIGS. 10 through 12 are cross-sectional views of panel bottom sheets according to other exemplary embodiments of the present disclosure. Specifically, FIGS. 10 through 12 show various main sheets with various stack structures.

Referring to FIG. 10, a main sheet 11 of a panel bottom sheet 102 may include a first heat dissipation layer 61, a first interlayer bonding layer 71, and a second heat dissipation layer 62.

The first heat dissipation layer 61 may be disposed at a lowest part of the main sheet 11, and the bottom surface of the first heat dissipation layer 61 may form the bottom surface of the main sheet 11. The first interlayer bonding layer 71 is disposed on the top surface of the first heat dissipation layer 61. The second heat dissipation layer 62 is disposed on the top surface of the first interlayer bonding layer 71. The first and second heat dissipation layers 61 and 62 may be bonded together by the first interlayer bonding layer 71.

The first heat dissipation layer 61 may comprise a metal film formed of copper (Cu) or silver (Ag). The second heat dissipation layer 62 may comprise graphite or carbon nanotubes (CNTs). The first interlayer bonding layer 71 and a top bonding layer 51 may comprise the same material as the first and second bonding layers 22 and 23 of the panel bottom sheet 100 according to the exemplary embodiment of FIG. 3.

The first heat dissipation layer 61 may be disposed in a cover region CR and in an exposed region ER. The first heat dissipation layer 61 may be disposed in both a flat area FA and bending area BA.

The second heat dissipation layer 62 may be disposed in the cover region CR, but not in the exposed region ER. The second heat dissipation layer 62 may be disposed in the flat area FA, but not in the bending area BA. The sides of a bottom bonding member 20 may be aligned with, or positioned more inwardly than, the sides of the second heat dissipation layer 62, but the present disclosure is not limited thereto.

The top bonding layer 51 and the second release film 50 may be sequentially disposed on the top surface of the second heat dissipation layer 62. The top bonding layer 51 may cover the second heat dissipation layer 62 and may extend in exposed parts of the first interlayer bonding layer 71. The top bonding layer 61 may be placed in direct contact with the first interlayer bonding layer 71 on the sides of the panel bottom sheet 102.

In one exemplary embodiment, the sides of the first heat dissipation layer 61, the sides of the first interlayer bonding layer 71, the sides of the top bonding layer 51, and the sides of the second release film 50 may be aligned with one another. As mentioned above, the sides of the second heat dissipation layer 62 may be positioned more inwardly than the sides of the first heat dissipation layer 61, the sides of the first interlayer bonding layer 71, the sides of the top bonding layer 51, and the sides of the second release film 50.

Referring to FIG. 11, a panel bottom sheet 103 differs from the panel bottom sheet 102 of FIG. 10 in that a main sheet 12 further includes a buffer member 63 and a support member 64.

A second interlayer bonding layer 72 is disposed on the top surface of a second heat dissipation layer 62. The second interlayer bonding layer 72 may be substantially the same as the top bonding layer 51 of FIG. 10.

The buffer member 63 is disposed on the top surface of the second interlayer bonding layer 72. The buffer member 63 absorbs an external shock and thus prevents the display device 600 from being damaged. The buffer member 63 may be formed as a single layer or as a stack of a plurality of films. The buffer member 63 may comprise a material with elasticity such as, for example, a PU or PE resin.

A third interlayer bonding layer 73 is disposed on the top surface of the buffer member 63, and the support member 64 is disposed on the top surface of the third interlayer bonding layer 73. The support member 64 may be formed of, for example, PET, PI, PC, PE, PP, PSF, PMMA, TAC, or a COP.

A top bonding layer 51*a* and a second release film 50*a* are disposed on the top surface of the support member 64.

The second interlayer bonding layer 72, the third interlayer bonding layer 73, and the top bonding layer 51*a* may be formed of one of the aforementioned examples of the material of the first and second bonding layers 22 and 23 of the panel bottom sheet 100 according to the exemplary embodiment of FIG. 3.

The second release film 50*a* may be substantially the same as its counterpart (second release film 50) of FIG. 9, except that an embossed shape may be formed on the surface of the second release film 50*a*. The embossed shape on the surface of the second release film 50*a* may be transferred onto the top bonding layer 51*a*, which is disposed adjacent to the second release film 50*a*, and as a result, an embossed shape that is complementary to the embossed shape on the surface of the second release film 50*a* may be formed on the top surface of the top bonding layer 51*a*. In a case where the top surface of the top bonding layer 51*a* has an embossed pattern, the embossed pattern of the top bonding layer 51*a* may serve as an air passage during the attachment of the panel bottom sheet 103 to the bottom of a display panel 200, and may thus reduce air bubbles. Once the top bonding layer 51*a* is completely attached to the bottom of the display panel 200, the embossed pattern on the top surface of the top bonding layer 51*a* may collapse and may be planarized.

The embossed pattern of the second release film 50*a* and the embossed pattern of the top bonding layer 51*a*, which is disposed adjacent to the second release film 50*a*, may be directly applicable to first or second release films and bottom bonding members of panel bottom sheets according to other exemplary embodiments of the present disclosure.

Referring to FIG. 12, a panel bottom sheet 104 differs from the panel bottom sheet 103 of FIG. 11 in that a main sheet 13 further includes a digitizer 80.

The panel bottom sheet 104 further includes the digitizer 80, which is disposed between a second interlayer bonding layer 72 and a buffer member 63, and a fourth interlayer bonding layer 74. That is, the digitizer 80 is disposed on the top surface of the second interlayer bonding layer 72, and the fourth interlayer bonding layer 74 is disposed on the top surface of the digitizer 80. The buffer member 63 is disposed on the top surface of the fourth interlayer bonding layer 74.

The digitizer 80 is a type of input device. The digitizer 80, unlike an input device such as a keyboard or a mouse, receives information regarding a position on a screen, designated by a user. The digitizer 80 recognizes the movement of, for example, a stylus pen, and converts the recognized movement into a digital signal. The digitizer 80 may be provided in the form of a thin film or panel.

In one exemplary embodiment, the digitizer 80 may include a plurality of electrodes (81 and 82). The plurality of electrodes (81 and 82) may be divided into two or more layers. For example, the digitizer 80 includes a first insulating film 83, the first electrode 81 disposed on the first insulating film 83, a second insulating film 84 covering the first electrode 81, the second electrode 82 disposed on the second insulating film 84, and a third insulating film 85 covering the second electrode 82. The first and second electrodes 81 and 82 may be patterned. The first and second electrodes 81 and 82 may be formed of a metal such as Cu or Ag.

The first, second, and third insulating films 83, 84, and 85 may comprise organic films formed of PI or may comprise inorganic films formed of silicon oxide, silicon nitride, or silicon oxynitride.

The fourth interlayer bonding layer 74 may be formed of one of the aforementioned examples of the material of the first and second bonding layers 22 and 23 of the panel bottom sheet 100 according to the exemplary embodiment of FIG. 3.

Figure 13:
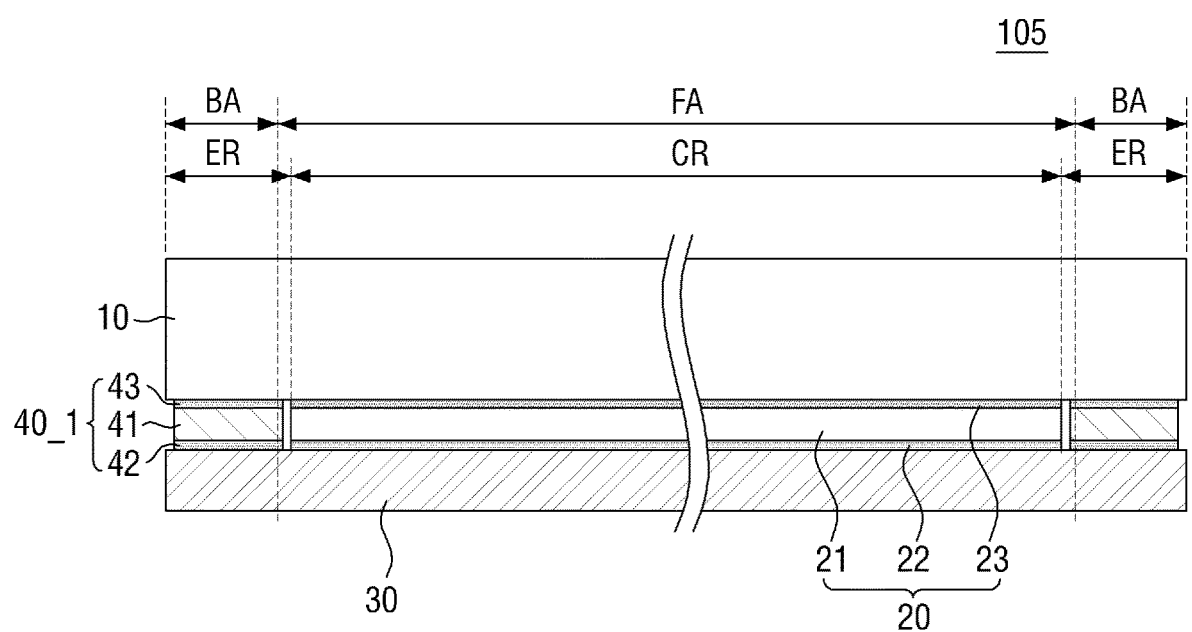
FIGS. 13, 14, and 15 are cross-sectional views of panel bottom sheets according to other exemplary embodiments of the present disclosure.
Figure 14:
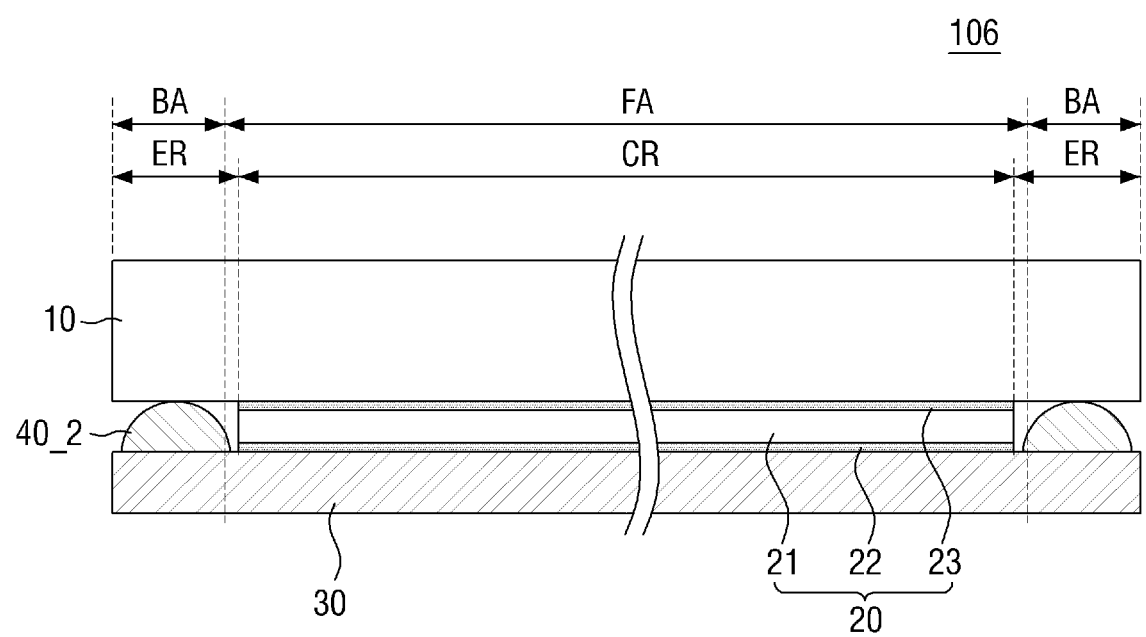
Figure 15:
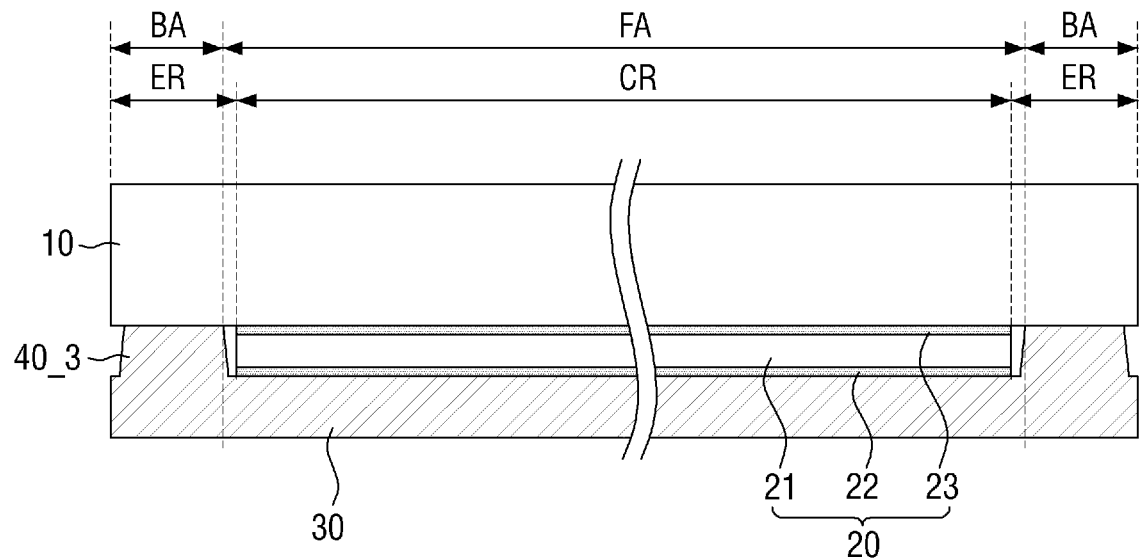

FIGS. 13 through 15 are cross-sectional views of panel bottom sheets according to other exemplary embodiments of the present disclosure. Specifically, FIGS. 13 through 15 show various modifications that can be made to the cross-sectional structure of the spacer 40 of FIG. 4. For convenience, all the elements of a panel bottom sheet 105, 106, or 107 of FIG. 13, 14, or 15, except for a spacer 40_1, 40_2, or 40_3, are illustrated as being the same as their respective counterparts of the panel bottom sheet 100 of FIG. 4, but the elements of the panel bottom sheet 105, 106, or 107 other than the spacer 40_1, 40_2, or 40_3 can also be varied without departing from the scope of the inventive concept of the present disclosure.

Referring to FIG. 13, the panel bottom sheet 105 differs from the panel bottom sheet 100 of FIG. 4 in that the spacer 40_1 has a double-sided tape structure. Specifically, the spacer 40_1 includes a spacing member 41, a bottom bonding layer 42 disposed on the bottom surface of the spacing member 41, and a top bonding layer 43 disposed on the top surface of the spacing member 41. The spacing member 41 and the bottom bonding layer 42 are substantially the same as their respective counterparts of FIG. 4, and thus, detailed descriptions thereof will be omitted.

The top bonding layer 43 is bonded to the bottom surface of the main sheet 10, and the bottom bonding layer 42 is bonded to the top surface of the first release film 30. As a result, the spacing member 41 may be fixed between the bottom surface of the main sheet 10 and the top surface of the first release film 30. Accordingly, any damage that may be caused by the friction between the top surface of the spacer 40_1 and the bottom surface of the main sheet 10 can be prevented. Also, the spacer 40_1 can stably compensate for a height difference during a pressing process.

When the first release film 30 is peeled off, the spacer 40_1 may be detached from the bottom surface of the main sheet 10, but may still be bonded to the top surface of the first release film 30. To this end, the bonding force of the top bonding layer 43 may be weaker than the bonding force of the bottom bonding layer 42. For example, the top bonding layer 43 of the spacer 40_1 may be formed to have a weaker bonding force than the bottom bonding layer 42 of the spacer 40_1. In another example, the bottom surface of the main sheet 10 or the top surface of the first release film 30 may be subjected to surface treatment or coated with a coating layer, thereby making the top bonding layer 43 and the bottom bonding layer 42 have different bonding forces.

Referring to FIG. 14, the panel bottom sheet 106 differs from the panel bottom sheet 100 of FIG. 4 in that the spacer 40_2 is formed directly on the top surface of a first release film 30. The spacer 40_2 may be a coating layer or a printed layer. The width of an upper portion of the spacer 40_2 may be smaller than the width of a lower portion of the spacer 40_2, but the present disclosure is not limited thereto. The spacer 40_2 may comprise an organic composition, an inorganic composition, or an organic-inorganic hybrid composition that can be formed directly on the top surface of the first release film 30 through coating or printing, but the present disclosure is not limited thereto.

Referring to FIG. 15, the panel bottom sheet 107 differs from the panel bottom sheet 100 of FIG. 4 in that the spacer 40_3 is formed in one integral body with a first release film 30. The spacer 40_3 may be formed of the same material as the first release film 30. The spacer 40_3 and the first release film 30 may be formed together by, for example, injection or extrusion.

For convenience, the spacer 40_3 and the first release film 30 are labeled separately even though they are formed in one integral body with each other. However, if necessary, the spacer 40_3 and the first release film 30 may be referred to as a release part and a spacer part, respectively, and the release part and the spacer part may be collectively referred to as a release film.

Figure 16:
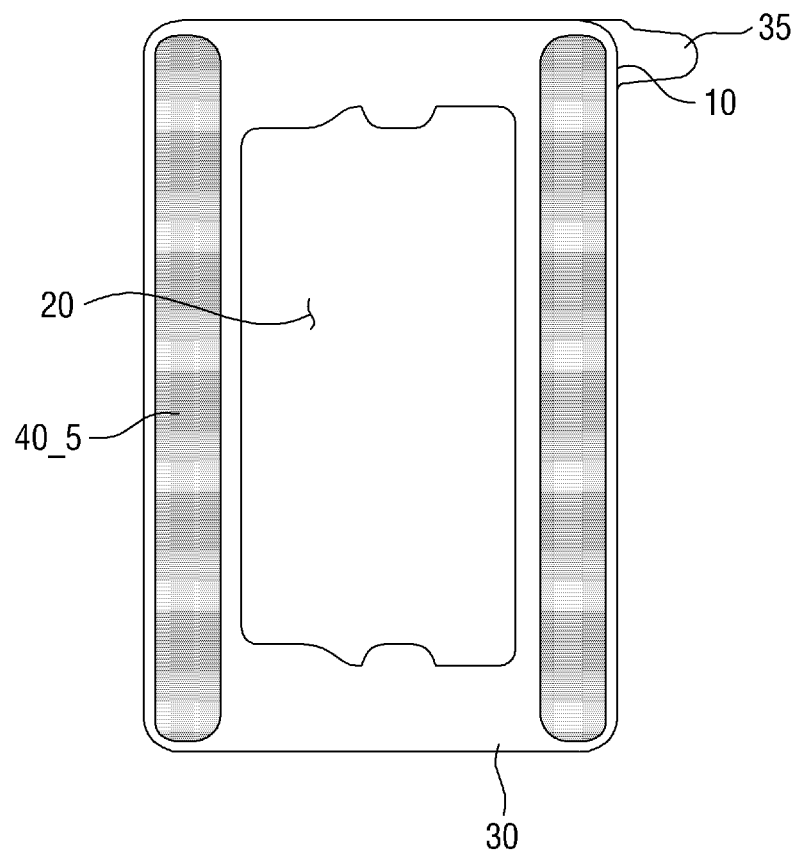
FIGS. 16 and 17 are layout views of panel bottom sheets according to other exemplary embodiments of the present disclosure.
Figure 17:
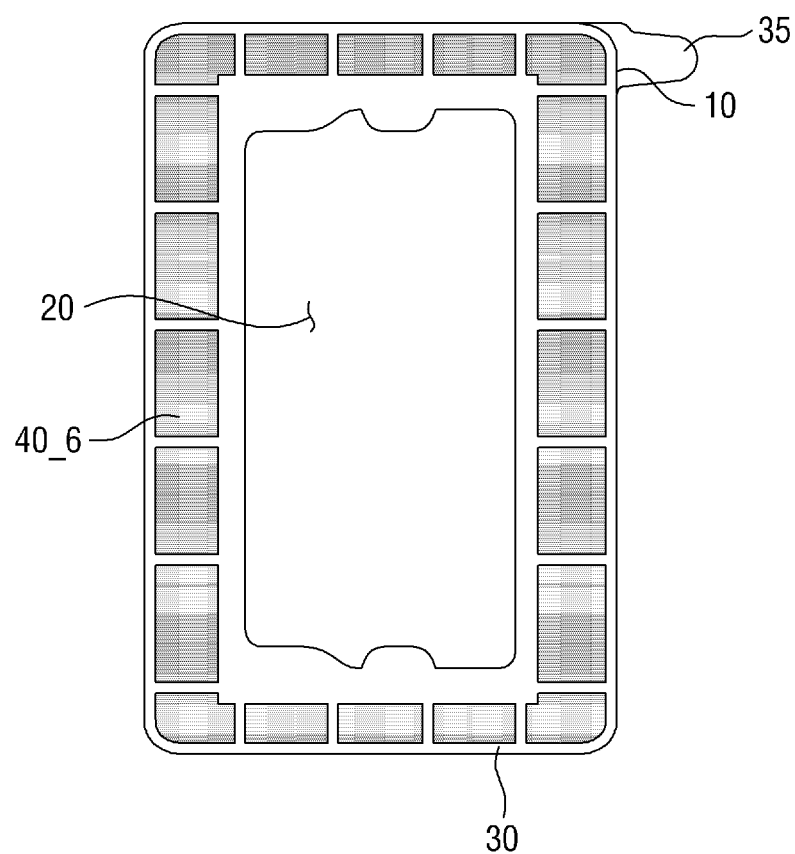

FIGS. 16 and 17 are layout views of panel bottom sheets according to other exemplary embodiments of the present disclosure. Specifically, FIGS. 16 and 17 show various modifications that can be made to the planar shape of the spacer 40 of FIG. 6.

Referring to FIG. 16, spacers 40_5 of a panel bottom sheet 108, unlike the spacer 40 of FIG. 6, overlap with only part of an exposed region ER of the bottom surface of a main sheet 10. In a case where the exposed region ER of the bottom surface of the main sheet 10 is in the shape of a rectangular frame with four sides and is disposed along the sides of the panel bottom sheet 108, the spacers 40_5 may be disposed to overlap with only some of the four sides of the exposed region ER.

In one exemplary embodiment, the spacers 40_5 may be disposed to overlap with only two of the four sides of the exposed region ER, i.e., two long sides. In this example, the spacers 40_5 may extend to the corners of the main frame 10 where the two long sides meet two short sides of the exposed region ER. The spacers 40_5 may be separated from each other. The spacers 40_5 may be disposed along the two short sides, only at and around the corners where the two short sides meet the two long sides.

In a case where the panel bottom sheet 108 is attached to a display panel 200 by moving a roller from one long side to the other long side of the display panel 200, as described above with reference to FIGS. 7 and 8, unevenness in pressing force that may be caused by a height difference may be more apparent and serious on the long sides of the display panel 200 than on the short sides of the display panel 200. Thus, the spacers 40_5 may be disposed along the long sides of the display panel 200 to compensate for a height difference, but not along the short sides of the display panel 200 where unevenness in pressing force is less apparent and serious.

Referring to FIG. 17, spacers 40_6 of a panel bottom sheet 109, unlike the spacer 40 of the panel bottom sheet 100 of FIG. 6, are provided as separate pieces. The spacers 40_6 may be formed as islands and may be spaced apart from one another. In a case where all or some of the spacers 40_6 are separated, a height difference may be formed in the spaces between the spacers 40_6. However, since pressing force can be maintained, at least in areas where the spacers 40_6 are disposed, unevenness in pressing force can be improved. Also, if the spaces between the spacers 40_6 where the height difference is formed are narrow, pressing force can be substantially uniformly transmitted throughout an entire exposed region ER.

Figure 18:
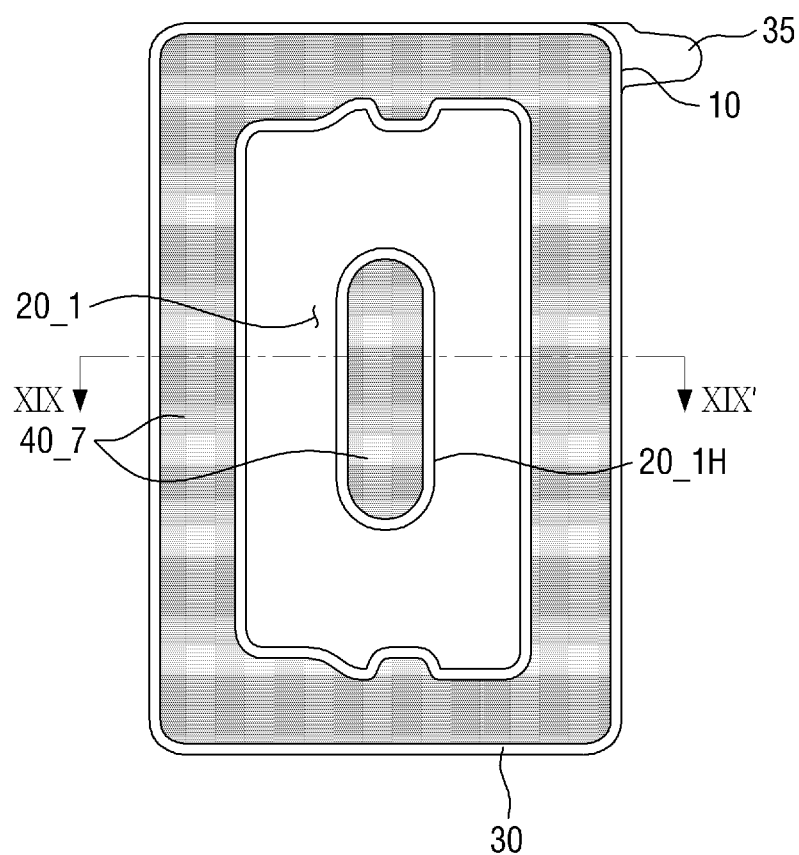
FIG. 18 is a layout view of a panel bottom sheet according to another exemplary embodiment of the present disclosure.
Figure 19:
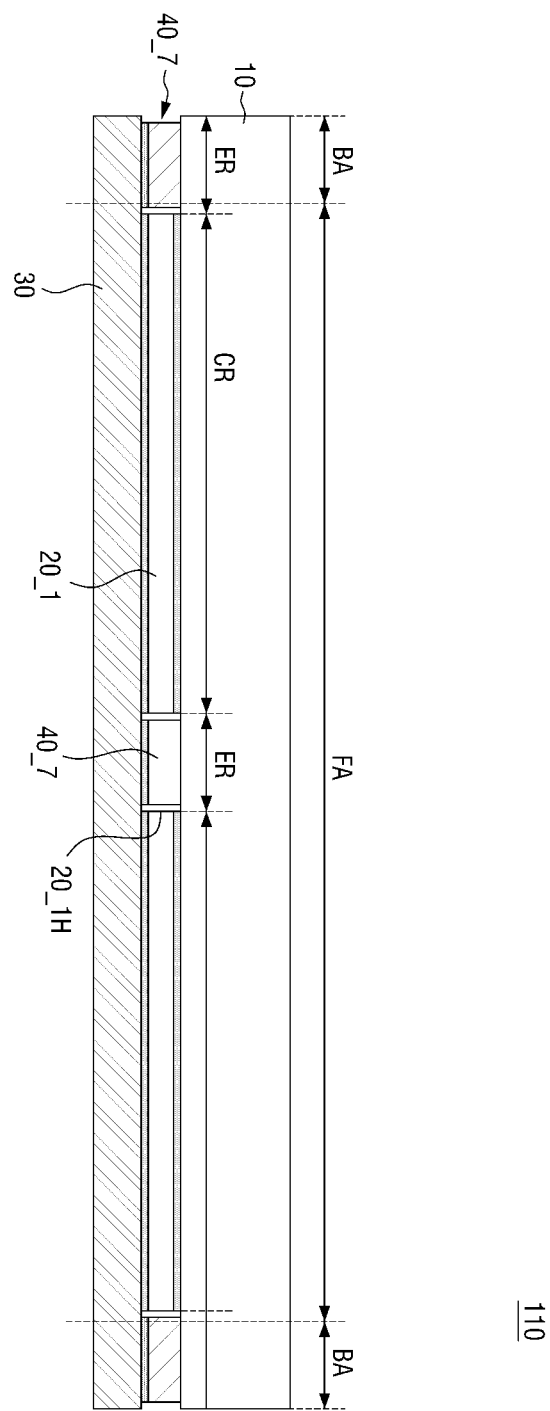
FIG. 19 is a cross-sectional view taken along line XIX-XIX' of FIG. 18.

FIG. 18 is a layout view of a panel bottom sheet according to another exemplary embodiment of the present disclosure. FIG. 19 is a cross-sectional view taken along line XIX-XIX' of FIG. 18.

Referring to FIGS. 18 and 19, a panel bottom sheet 110 differs from the panel bottom sheet 100 of FIG. 6 in that a hole 20_1H is formed inside a bottom bonding member 20_1. The hole 20_1H of the bottom bonding member 20_1 may become an exposed region ER where the bottom bonding member 20_1 is not disposed. The exposed region ER may form a height difference. However, since spacers 40_7 are provided, even in the hole 20_1H of the bottom bonding member 20_1, the height difference formed by the exposed region ER can be compensated for. If the hole 20_1H is significantly small or unevenness in pressing force is relatively unserious at or around the hole 20_1H, the spacers 40_7 may not be provided in the hole 20_1H.

FIGS. 18 and 19 illustrate an example in which a single hole 20_1H is formed in the bottom bonding member 20_1, but alternatively, two or more holes may be formed in the bottom bonding member 20_1, in which case, the spacers 40_7 may be formed in all or only some of the holes.

While exemplary embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further exemplary embodiments of the present disclosure.

What is claimed is:

1. A panel bottom sheet, comprising:
    a main sheet;
    a bonding member disposed on a bottom surface of the main sheet and partially exposing the bottom surface of the main sheet;
    a release film disposed below the bonding member; and
    a spacer disposed between the release film and the bottom surface of the main sheet,
    wherein:
    the bottom surface of the main sheet is divided into a cover region in which the bonding member is disposed and an exposed region which is exposed by the bonding member,
    the release film is disposed to overlap with the cover region and the exposed region, and
    the spacer is disposed to overlap with the exposed region.

2. The panel bottom sheet of claim 1, wherein the spacer is disposed to be spaced apart from the bonding member.

3. The panel bottom sheet of claim 2, wherein a bottom surface of the spacer is bonded to the release film.

4. The panel bottom sheet of claim 3, wherein the top surface of the spacer is bonded to the bottom surface of the main sheet.

5. The panel bottom sheet of claim 4, wherein:
    the spacer includes a spacing member, a bottom bonding layer disposed on a bottom surface of the spacing member, and a top bonding layer disposed on a top surface of the spacing member, and
    a bonding force between the top bonding layer and the bottom surface of the main sheet is weaker than a bonding force between the bottom bonding layer and a top surface of the release film.

6. The panel bottom sheet of claim 3, wherein a top surface of the spacer is not physically bonded to the bottom surface of the main sheet.

7. The panel bottom sheet of claim 6, wherein the spacer includes a single-sided tape having a spacing member and a bottom bonding layer disposed on a bottom surface of the spacing member.

8. The panel bottom sheet of claim 6, wherein the spacer includes a coating layer or a printed layer formed directly on a top surface of the release film.

9. The panel bottom sheet of claim 1, wherein a thickness of the spacer is the same as a thickness of the bonding member.

10. The panel bottom sheet of claim 1, wherein:
the cover region is located at a central portion of the bottom surface of the main sheet, and
the exposed region is located along edges of the bottom surface of the main sheet.

11. The panel bottom sheet of claim 10, wherein the spacer is disposed continuously along edges of the release film.

12. The panel bottom sheet of claim 1, wherein the bonding member includes a double-sided tape.

13. The panel bottom sheet of claim 1, further comprising:
a top bonding layer disposed on the top surface of the main sheet.

14. The panel bottom sheet of claim 13, wherein:
the top bonding layer is larger in size than the bonding member, and
a side of the bonding member is positioned more inwardly than a side of the top bonding layer.

15. The panel bottom sheet of claim 1, wherein the main sheet includes at least one heat dissipation layer.

16. The panel bottom sheet of claim 15, wherein the main sheet further includes a first heat dissipation layer, an interlayer bonding layer disposed on a top surface of the first heat dissipation layer, and a second heat dissipation layer disposed on a top surface of the interlayer bonding layer.

17. The panel bottom sheet of claim 16, wherein sides of the second heat dissipation layer are positioned more inwardly than sides of the first heat dissipation layer.

18. The panel bottom sheet of claim 15, wherein the main sheet further includes a buffer member disposed above the at least one heat dissipation layer.

19. The panel bottom sheet of claim 18, wherein the main sheet further includes a digitizer disposed between the at least one heat dissipation layer and the buffer member.

20. A display device, comprising:
a display panel; and
a panel bottom sheet disposed below the display panel, the panel bottom sheet including a main sheet, a bonding member disposed on a bottom surface of the main sheet and partially exposing the bottom surface of the main sheet, a release film disposed below the bonding member, and a spacer disposed between the release film and the bottom surface of the main sheet,
wherein:
the bottom surface of the main sheet is divided into a cover region in which the bonding member is disposed and an exposed region which is exposed by the bonding member,
the release film is disposed to overlap with the cover region and the exposed region, and
the spacer is disposed to overlap with the exposed region.

21. The display device of claim 20, wherein the spacer is disposed to be spaced apart from the bonding member.

22. The display device of claim 21, wherein a bottom surface of the spacer is bonded to the release film.

23. The display device of claim 20, wherein a thickness of the spacer is the same as a thickness of the bonding member.

24. The display device of claim 20, wherein:
the cover region is located at a central portion of the bottom surface of the main sheet, and
the exposed region is located along edges of the bottom surface of the main sheet.

25. The display device of claim 24, wherein the spacer is disposed continuously along edges of the release film.

26. The display device of claim 20, wherein the bonding member includes a double-sided tape.

27. The display device of claim 20, wherein:
the main sheet includes a first heat dissipation layer, an interlayer bonding layer disposed on a top surface of the first heat dissipation layer, and a second heat dissipation layer disposed on a top surface of the interlayer bonding layer, and
a side of the second heat dissipation layer is positioned more inwardly than a side of the first heat dissipation layer.

28. The display device of claim 27, wherein the main sheet further includes a buffer member disposed above the at least one heat dissipation layer.

29. The display device of claim 28, wherein the main sheet further includes a digitizer disposed between the at least one heat dissipation layer and the buffer member.

30. The display device of claim 20, wherein:
the display device has a flat area and bending area disposed adjacent to the flat area, and
the display panel and the panel bottom sheet are positioned in both the flat area and the bending area.

31. The display device of claim 30, wherein
the cover region is located within the flat area and does not overlap with the bending area, and
the exposed region overlaps with the bending area.

* * * * *